(12) United States Patent
Huang

(10) Patent No.: US 12,476,116 B2
(45) Date of Patent: Nov. 18, 2025

(54) SEMICONDUCTOR STRUCTURE WITH ANTI-BACK-SPUTTER LAYER

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 545 days.

(21) Appl. No.: 18/081,846

(22) Filed: Dec. 15, 2022

(65) Prior Publication Data

US 2024/0203752 A1    Jun. 20, 2024

(51) Int. Cl.
| | | |
|---|---|---|
| *H01L 21/3213* | (2006.01) | |
| *H01L 21/033* | (2006.01) | |
| *H01L 21/768* | (2006.01) | |
| *H01L 23/528* | (2006.01) | |

(52) U.S. Cl.
CPC .... *H01L 21/32139* (2013.01); *H01L 21/0337* (2013.01); *H01L 23/528* (2013.01); *H01L 21/0332* (2013.01); *H01L 21/76885* (2013.01)

(58) Field of Classification Search
CPC ......... H01L 21/76885; H01L 21/32136; H01L 21/768905; H01L 23/481; H01L 21/32139; H01L 21/0337; H01L 23/528; H01L 21/0332
See application file for complete search history.

(56) References Cited

U.S. PATENT DOCUMENTS

| | | | | |
|---|---|---|---|---|
| 5,786,259 A | * | 7/1998 | Kang | H10D 1/68 438/240 |
| 6,001,726 A | * | 12/1999 | Nagabushnam | H01L 21/76885 438/630 |
| 6,010,931 A | * | 1/2000 | Sun | H10B 12/033 257/E21.648 |
| 10,134,629 B1 | * | 11/2018 | Hung | H01L 21/76846 |
| 2003/0045108 A1 | * | 3/2003 | Tsai | H01L 21/7684 438/692 |
| 2005/0275046 A1 | * | 12/2005 | Goldbach | H01L 21/28044 257/E21.198 |
| 2021/0074840 A1 | * | 3/2021 | Chen | H01L 21/02532 |

FOREIGN PATENT DOCUMENTS

| | | |
|---|---|---|
| TW | 515042 B | 12/2002 |
| TW | 202119475 A | 5/2021 |

OTHER PUBLICATIONS

Williams et al. Etch Rates for Micromachinging processing, Part II. Journal of Microelectromechanical systems, vol. 12, No. 6, 2003 (Year: 2003).*
Office Action and and the search report mailed on Feb. 23, 2024 related to Taiwanese Application No. 112118170.
Office Action and and the search report mailed on Mar. 29, 2024 related to Taiwanese Application No. 113103472.

* cited by examiner

*Primary Examiner* — Galina G Yushina
(74) *Attorney, Agent, or Firm* — Xuan Zhang

(57) ABSTRACT

The present application discloses a semiconductor structure and a method for fabricating the semiconductor device. The semiconductor structure includes a substrate; a conductive feature positioned on the substrate; an anti-back sputtering layer positioned on the conductive feature; and a first hard mask structure positioned on the anti-back sputtering layer. The anti-back sputtering layer has etching selectivity to the first hard mask structure.

10 Claims, 12 Drawing Sheets

SEMICONDUCTOR STRUCTURE WITH ANTI-BACK-SPUTTER LAYER

TECHNICAL FIELD

The present disclosure relates to a semiconductor device, and more particularly, to a semiconductor structure with an anti-back sputtering layer.

DISCUSSION OF THE BACKGROUND

Semiconductor structures are used in a variety of electronic applications, such as personal computers, cellular telephones, digital cameras, and other electronic equipment. The dimensions of semiconductor structures are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure including a substrate; a conductive feature positioned on the substrate; an anti-back sputtering layer positioned on the conductive feature; and a first hard mask structure positioned on the anti-back sputtering layer. The anti-back sputtering layer has etching selectivity to the first hard mask structure.

Another aspect of the present disclosure provides a semiconductor structure including a substrate including a dense area and a loose area; a plurality of first conductive features positioned on the dense area and a plurality of second conductive features positioned on the loose area; a plurality of anti-back sputtering layers positioned on the plurality of first conductive features; a plurality of first hard mask structures positioned on the plurality of anti-back sputtering layers; and a plurality of second hard mask structures positioned on the plurality of second conductive features. The plurality of anti-back sputtering layers have etching selectivity to the plurality of first hard mask structures.

Another aspect of the present disclosure provides a method for fabricating a semiconductor structure including providing a substrate; forming a layer of first conductive material on the substrate; forming an anti-back sputtering layer on the layer of first conductive material; forming a layer of first hard mask material on the anti-back sputtering layer; forming a layer of second hard mask material on the layer of first hard mask material; performing a first hard mask removal process to turn the layer of second hard mask material into a first top hard mask layer; forming a plurality of first sidewall hard mask layers on sidewalls of the first top hard mask layer; performing a second hard mask removal process to turn the layer of first hard mask material into a first bottom hard mask layer; and performing a breakthrough process to remove the anti-back sputtering layer not covered by the first top hard mask layer, the plurality of first sidewall hard mask layers, and the first bottom hard mask layer and turn the layer of first conductive material into a conductive feature. The first top hard mask layer, the plurality of first sidewall hard mask layers, and the first bottom hard mask layer together configure a first hard mask structure. The anti-back sputtering layer has etching selectivity to the first hard mask structure.

Due to the design of the semiconductor structure of the present disclosure, the defects (such as short of conductive features) originating from the back sputtering of underlying conductive layer during the patterning of the hard mask layers may be avoided by the anti-back sputtering layer. As a result, the yield of fabrication of the semiconductor structure may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
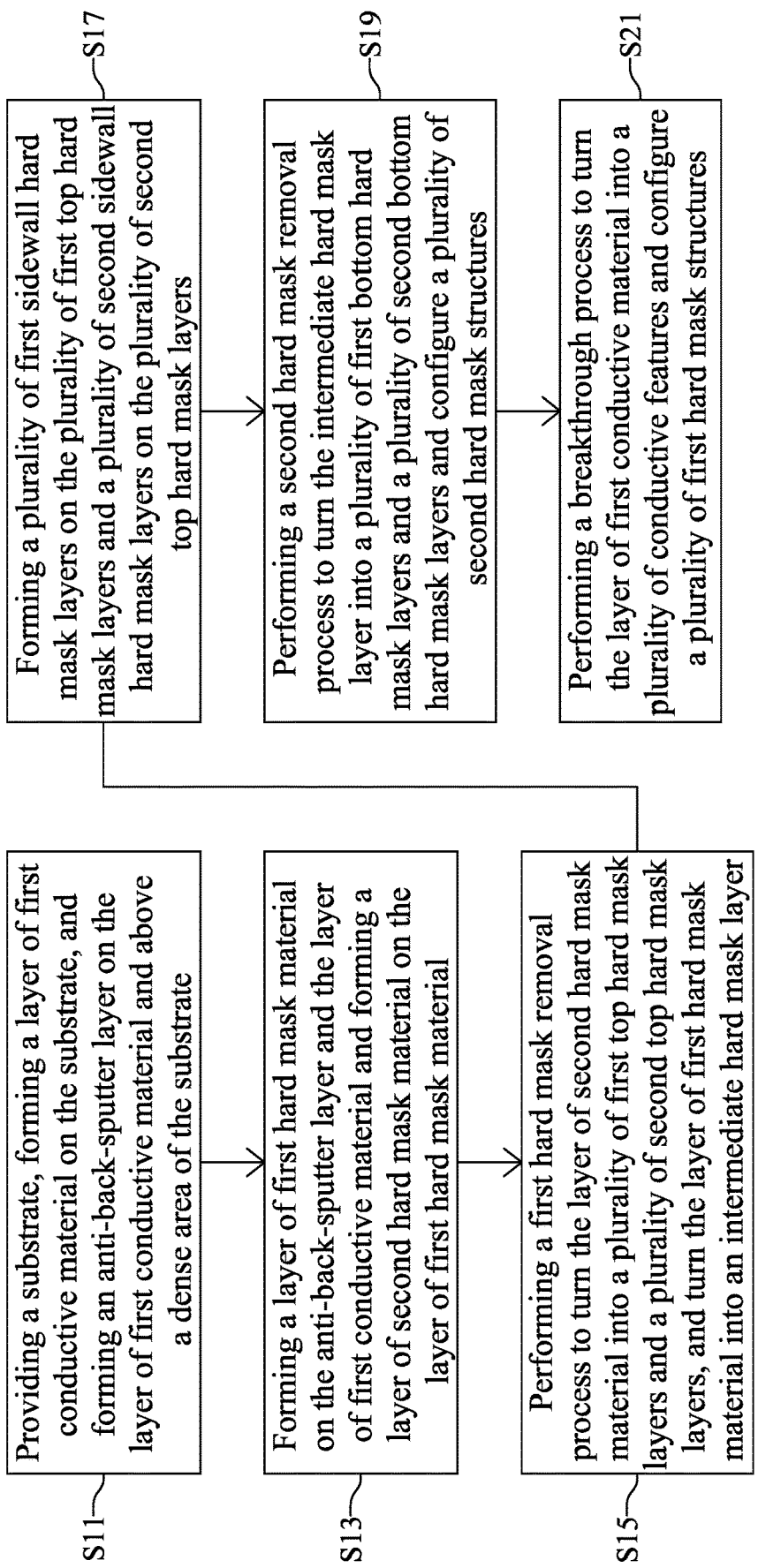
FIG. 1 illustrates, in a flowchart diagram form, a method 10 for fabricating a semiconductor structure 1 in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used heS13rein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor structure generally means a device which can function by utilizing semiconductor characteristics, and an electro-optic device, a light-emitting display device, a semiconductor circuit, and an electronic device are all included in the category of the semiconductor structure.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

FIG. 1 illustrates, in a flowchart diagram form, a method 10 for fabricating a semiconductor structure 1 in accordance with one embodiment of the present disclosure. FIGS. 2 to 12 illustrate, in schematic cross-sectional view diagrams, a flow for fabricating the semiconductor structure 1 in accordance with one embodiment of the present disclosure.

With reference to FIGS. 1 to 4, at step S11, a substrate 101 may be provided, a layer of first conductive material 501 may be formed on the substrate 101, and an anti-back sputtering layer 201 may be formed on the layer of first conductive material 501 and above a dense area DA of the substrate 101.

Figure 2:
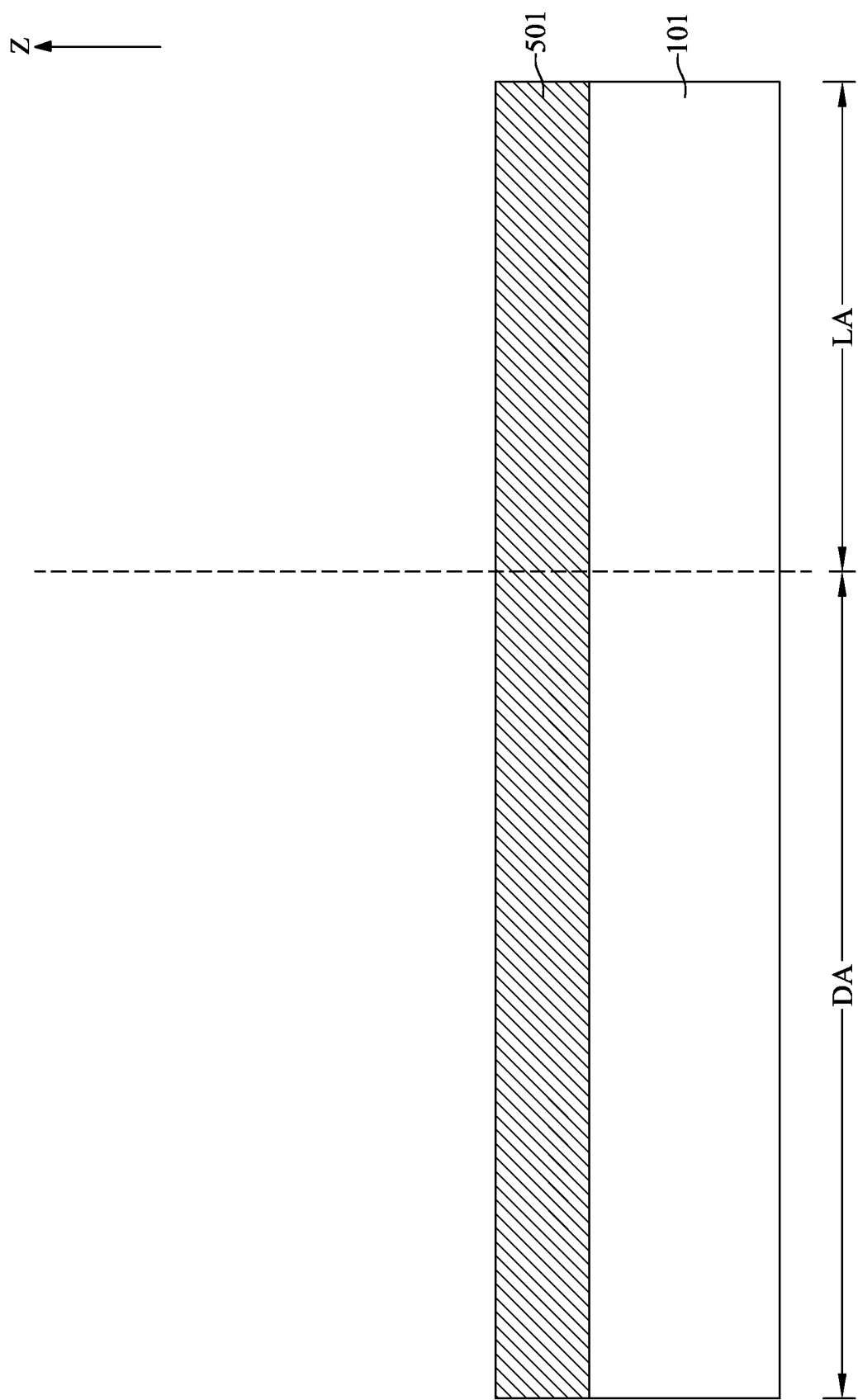
FIGS. 2 to 12 illustrate, in schematic cross-sectional view diagrams, a flow for fabricating the semiconductor structure 1 in accordance with one embodiment of the present disclosure.

With reference to FIG. 2, the substrate 101 may include the dense area DA and a loose area LA. In some embodiments, the dense area DA may be adjacent to the loose area LA. In some embodiments, the dense area DA and the loose area LA may be separated from each other.

It should be noted that, in the description of the present disclosure, the dense area DA may comprise a portion of the substrate 101 and spaces above and under the portion of the substrate 101. Describing an element as being disposed on the dense area DA means that the element is disposed on a top surface of the portion of the substrate 101. Describing an element as being disposed in the dense area DA means that the element is disposed in the portion of the substrate 101; however, a top surface of the element may be even with the top surface of the portion of the substrate 101. Describing an element as being disposed above the dense area DA means that the element is disposed above the top surface of the portion of the substrate 101. Describing an element as being disposed under the dense area DA means that the element is disposed under the bottom surface of the portion of the substrate 101; wherein the element contacts the bottom surface of the portion of the substrate 101 or is distant from the bottom surface of the portion of the substrate 101. Accordingly, the loose area LA may comprise another portion of the substrate 101 and spaces above and under the other portion of the substrate 101.

In some embodiments, the substrate 101 may include a bulk semiconductor substrate that is composed entirely of at least one semiconductor material, a plurality of device elements (not shown for clarity), a plurality of dielectric layers (not shown for clarity), and a plurality of conductive features (not shown for clarity). The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 101 may further include a semiconductor-on-insulator structure which consists of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

It should be noted that, in the description of present disclosure, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The plurality of device elements may be formed on the substrate 101. Some portions of the plurality of device elements may be formed in the substrate 101. The plurality of device elements may be transistors such as complementary metal-oxide-semiconductor transistors, metal-oxide-semiconductor field-effect transistors, fin field-effect-transistors, the like, or a combination thereof.

The plurality of dielectric layers may be formed on the substrate 101 and cover the plurality of device elements. In some embodiments, the plurality of dielectric layers may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The plurality of dielectric layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

The plurality of conductive features may include interconnect layers, conductive vias, and conductive pads. The interconnect layers may be separated from each other and may be horizontally disposed in the plurality of dielectric layers along the direction Z. In the present embodiment, the topmost interconnect layers may be designated as the conductive pads. The conductive vias may connect adjacent interconnect layers along the direction Z, adjacent device element and interconnect layer, and adjacent conductive pad and interconnect layer. In some embodiments, the conductive vias may improve heat dissipation and may provide structure support. In some embodiments, the plurality of conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of conductive features may be formed during the formation of the plurality of dielectric layers.

In some embodiments, the plurality of device elements and the plurality of conductive layers may together configure functional units of the semiconductor structure 1. A functional unit, in the description of the present disclosure, generally refers to functionally related circuitry that has been partitioned for functional purposes into a distinct unit. In some embodiments, the functional units of the semiconductor structure 1 may include, for example, highly complex circuits such as processor cores, memory controllers, accelerator units, or other applicable functional circuitry.

With reference to FIG. 2, the layer of first conductive material 501 may be formed on the dense area DA and the loose area LA of the substrate 101. In some embodiments, the first conductive material 501 may be, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the layer of first conductive material 501 may be formed by, for example, physical vapor deposition, chemical vapor deposition, sputtering, electroplating, or other applicable deposition processes.

Figure 3:
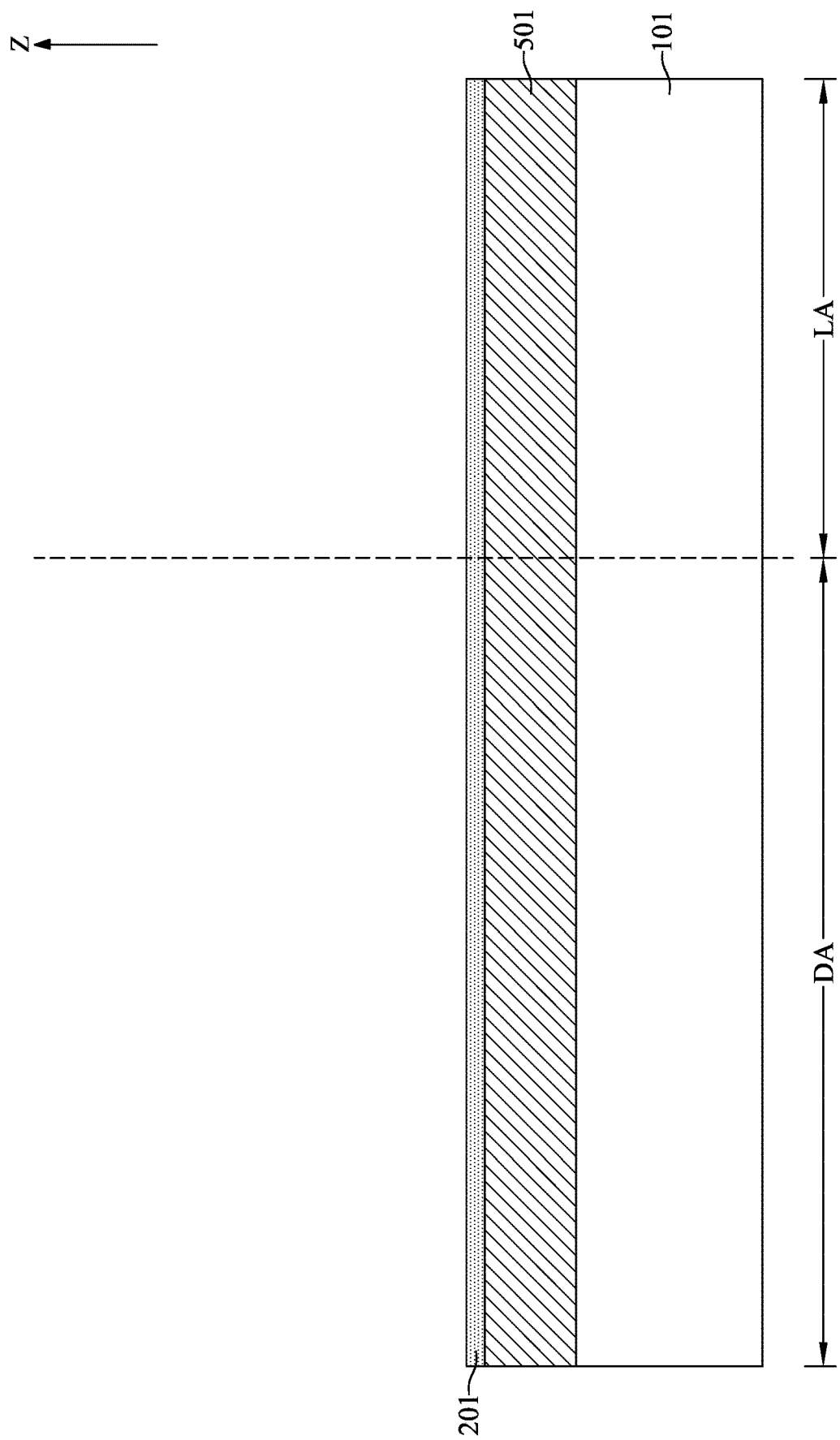

With reference to FIG. 3, the anti-back sputtering layer 201 may be formed on the layer of first conductive material 501. It should be noted that the anti-back sputtering layer 201 may be formed above the dense area DA and the loose area LA of the substrate 101. In some embodiments, the anti-back sputtering layer 201 may be formed of, for example, amorphous silicon.

Alternatively, in some embodiments, the anti-back sputtering layer 201 may be formed of, for example, a material including $sp^2$ hybridized carbon atoms. In some embodiments, the anti-back sputtering layer 201 may be formed of, for example, a material including carbons having hexagonal crystal structures. In some embodiments, the anti-back sputtering layer 201 may be formed of, for example, graphene, graphite, or the like.

In some embodiments, the layer of fourth conductive material 509 may be formed on a catalyst substrate and then transferred onto the intermediate semiconductor structure illustrated in FIG. 2. The catalyst substrate may include nickel, copper, cobalt, platinum, silver, ruthenium, iridium, palladium, alloy of iron and nickel, alloy of copper and nickel, alloy of nickel and molybdenum, alloy of gold and nickel, and alloy of cobalt and copper.

In some embodiments, a catalytic conductive layer (not shown for clarity) may be conformally formed on the layer of first conductive material 501. The anti-back sputtering layer 201 may be formed on the catalytic conductive layer. The catalytic conductive layer may include nickel, copper, cobalt, platinum, silver, ruthenium, iridium, palladium, alloy of iron and nickel, alloy of copper and nickel, alloy of nickel and molybdenum, alloy of gold and nickel, and alloy of cobalt and copper.

In some embodiments, the anti-back sputtering layer 201 may be formed with the assistance of catalysts. The catalysts may be single crystalline metal or polycrystalline metal, binary alloy, or liquid metal. The single crystalline metal or polycrystalline metal may be, for example, nickel, copper, cobalt, platinum, silver, ruthenium, iridium, or palladium. The binary alloy may be, for example, alloy of iron and nickel, alloy of copper and nickel, alloy of nickel and molybdenum, alloy of gold and nickel, and alloy of cobalt and copper. The liquid metal may be, for example, liquid gallium, liquid indium, or liquid copper.

Alternatively, the anti-back sputtering layer 201 may be formed of, for example, silicon carbide. The anti-back sputtering layer 201 may be formed by, for example, a plasma-enhanced chemical vapor deposition process. The formation of the anti-back sputtering layer 201 may include a deposition step and a flowing step. The deposition step and the flowing step may be referred to as one cycle. Multiple cycles may be performed to obtain the desired thickness of the anti-back sputtering layer 201. For example, the number of cycles of forming the anti-back sputtering layer 201 may be between about 20 and 120, between about 40 and 100, or between about 50 and 90.

During the deposition step, the precursor may be supplied with the carrier gas. The carrier gas may be an inert gas such as argon or helium. In some embodiments, the carrier gas may be continuously supplied. The plasma for the deposition may be generated in situ, for example, in an atmosphere of inert gas that flows continuously throughout the deposition step. For another example, the plasma may be generated remotely and provided to the reaction chamber containing the intermediate semiconductor structure. In some embodiments, the precursor may be, for example, monoacetylsilane, monovinylsilane, or phenylsilane. In some embodiments, the flow rate of the precursor of the deposition step may be between about 0.001 g/min and about 0.1 g/min. In some embodiments, the flow rate of the carrier gas of the deposition step may be between about 100 sccm and about 4000 sccm. In some embodiments, the duration of the deposition step may be between about 0.1 seconds and about 3 seconds. In some embodiments, the process temperature of the deposition step may be between about 50° C. and about 400° C. In some embodiments, the process pressure of the deposition step may be between about 200 Pa and about 2000 Pa. In some embodiments, the radio frequency (RF) power of the deposition step may be between 50 W and about 500 W.

It should be noted that, in the description of the present disclosure, the term "precursor" refers generally to a compound that participates in the chemical reaction that produces another compound, and particularly to a compound that constitutes a film matrix (or a layer matrix) or a main skeleton of a film (or a layer). The term "inert gas" refers to a gas that excites a precursor when RF power is applied. The inert gas does not become a part of a film matrix (or a layer matrix).

During the flowing step, the precursor may be stopped, and the carrier gas such as noble gases and nitrogen gas may be solely supplied. In some embodiments, the flow rate of the carrier gas of the flowing step may be between about 100 sccm and about 4000 sccm. In some embodiments, the duration of the flowing step may be between about 0.1 seconds and about 10 seconds. In some embodiments, the process temperature of the flowing step may be between about 50° C. and about 400° C. In some embodiments, the process pressure of the flowing step may be between about 200 Pa and about 2000 Pa. In some embodiments, the RF power of the flowing step may be between 100 W and about 1000 W.

Figure 4:
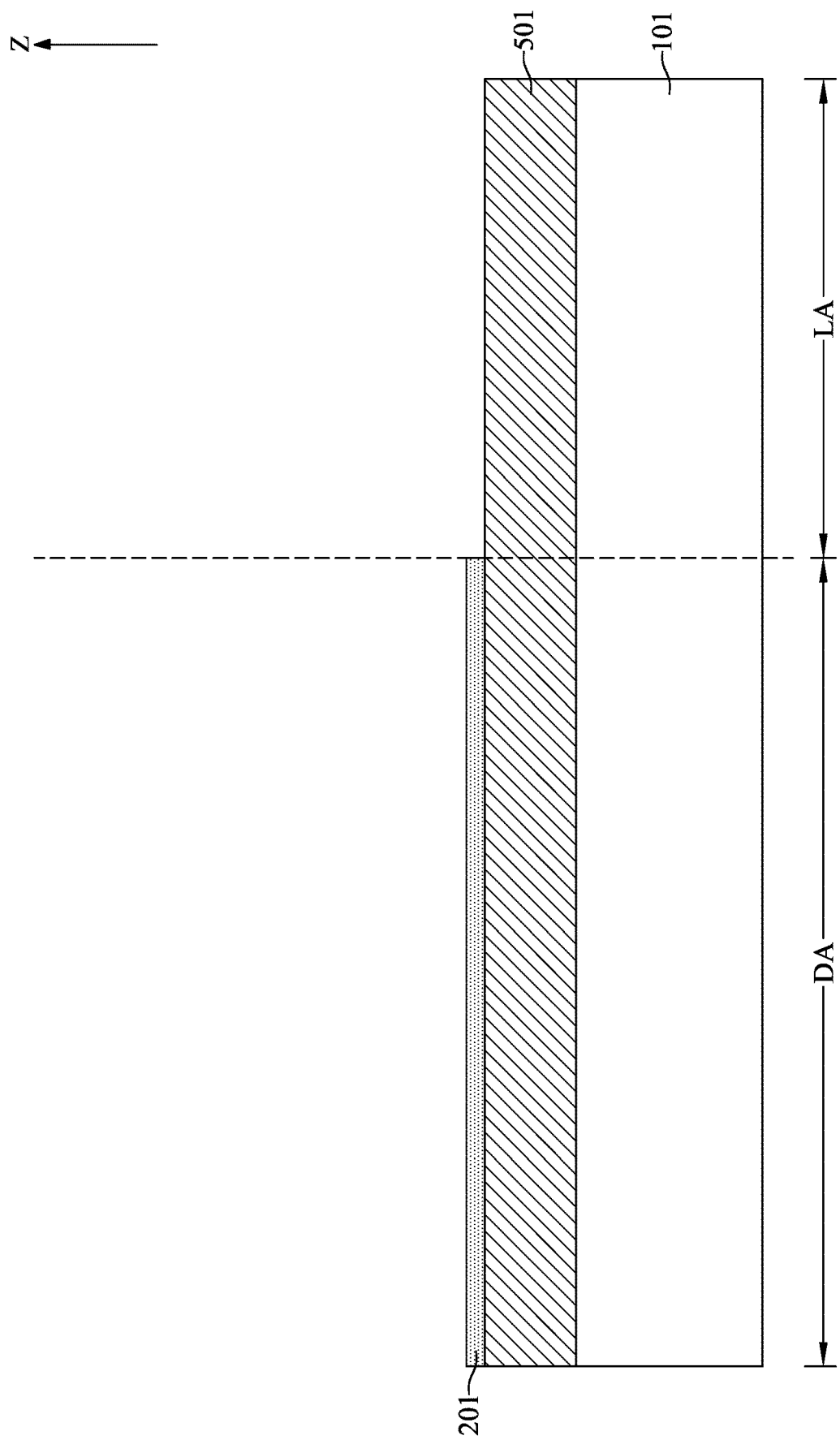

With reference to FIG. 4, the anti-back sputtering layer 201 formed above the loose area LA may be removed by a first removal process. During the first removal process, the anti-back sputtering layer 201 formed above the dense area DA may be covered by a mask layer (not shown for clarity). In some embodiments, the removal rate ratio of the anti-back sputtering layer 201 to the first conductive material 501 may be between about 100:1 and about 1.05:1, between about 15:1 and about 2:1, or between about 10:1 and about 2:1 during the first removal process.

Figure 5:
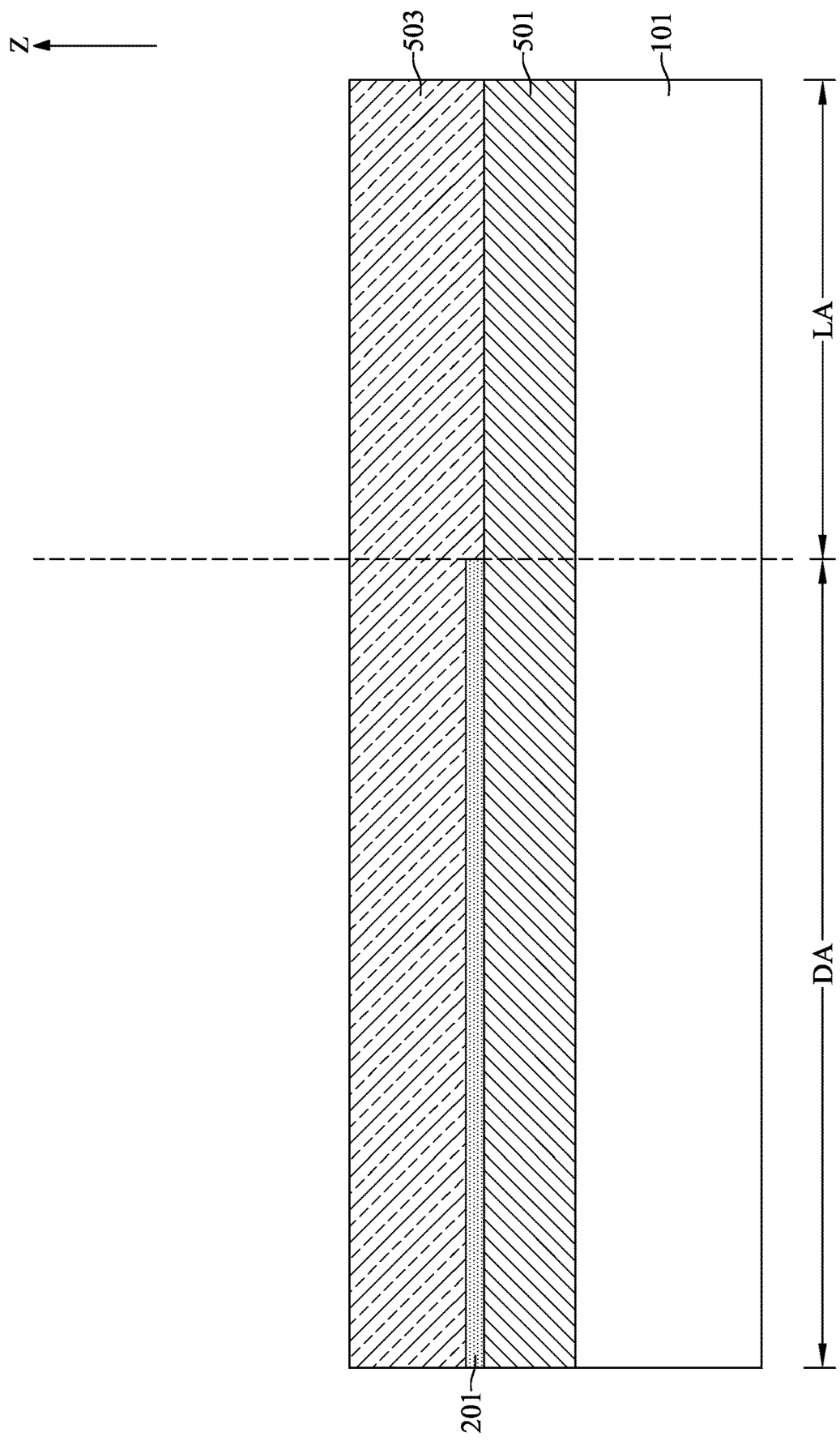
Figure 6:
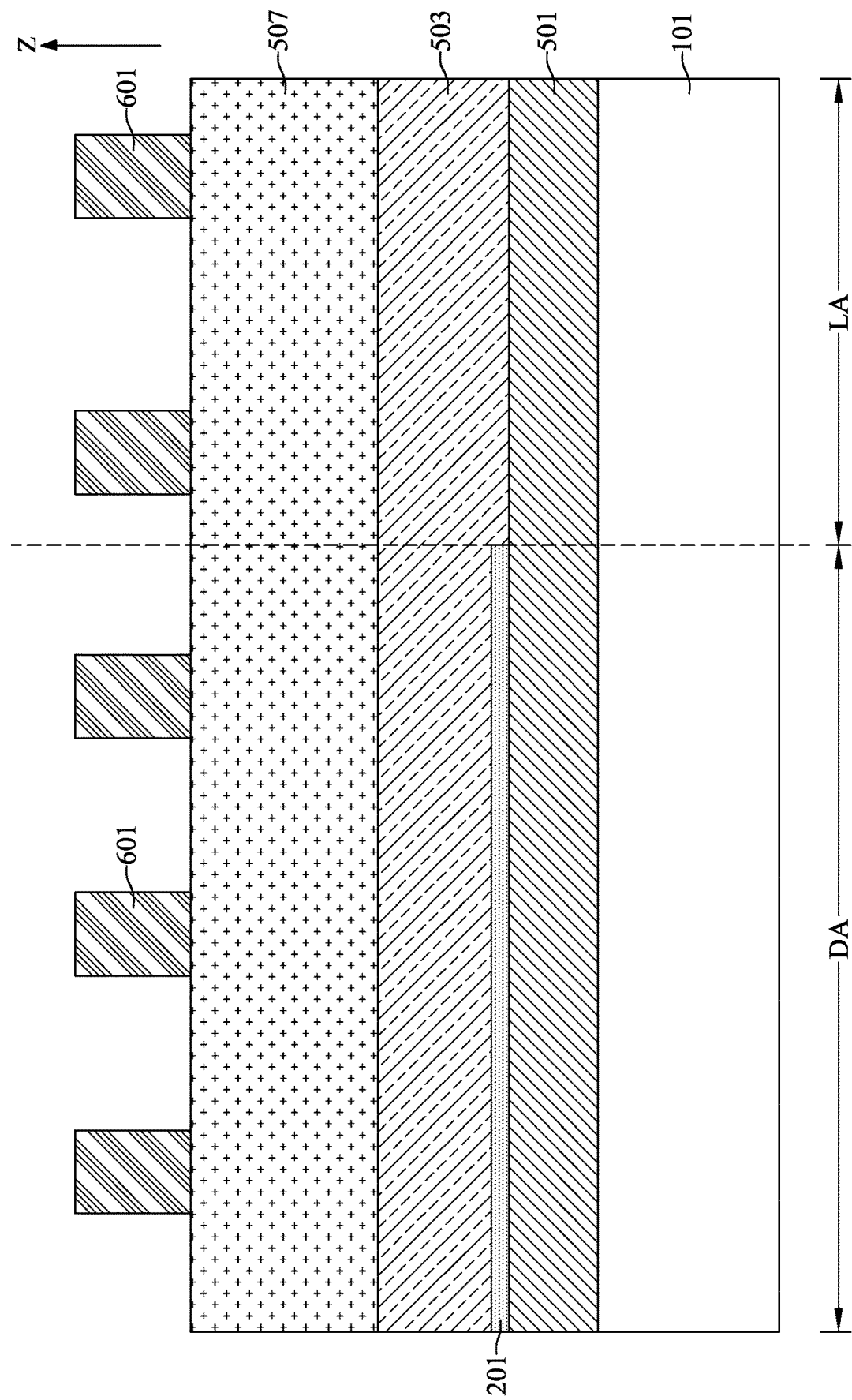

With reference to FIGS. 1, 5, and 6, at step S13, a layer of first hard mask material 503 may be formed on the anti-back sputtering layer 201 and the layer of first conductive material 501 and a layer of second hard mask material 507 may be formed on the layer of first hard mask material 503.

With reference to FIG. 5, the layer of first hard mask material 503 may be formed over the dense area DA and the loose area LA of the substrate 101 to cover the anti-back sputtering layer 201 and the layer of first conductive material 501. A planarization process, such as chemical mechanical polishing, may be performed to provide a substantially flat surface for subsequent processing steps. In some embodiments, the first hard mask material 503 may be a material have etching selectivity to the anti-back sputtering layer 201 and/or the first conductive material 501. In some embodiments, the first hard mask material 503 may be, for example, silicon nitride, silicon nitride oxide, silicon oxy nitride, silicon oxide, boron nitride, silicon boron nitride, phosphorus boron nitride, or boron carbon silicon nitride.

In some embodiments, the first hard mask material 503 may be composed of carbon, hydrogen, and oxygen. In some embodiments, the first hard mask material 503 may be composed of carbon, hydrogen, and fluorine. In some embodiments, the layer of first hard mask material 503 may be a carbon film. The term "carbon film" is used herein to describe materials whose mass is primarily carbon, whose structure is defined primarily by carbon atoms, or whose physical and chemical properties are dominated by its carbon content. The term "carbon film" is meant to exclude materials that are simply mixtures or compounds that include carbon, for example dielectric materials such as carbon-doped silicon oxynitride, carbon-doped silicon oxide or carbon-doped polysilicon.

In some embodiments, when the first hard mask material 503 is formed of boron nitride, the layer of first hard mask material 503 may be formed by a film formation process and a treatment process. Detailedly, in the film formation process, first precursors, which may be boron-based precursors, may be introduced over the anti-back sputtering layer 201 and the layer of first conductive material 501 to form a boron-based layer. Subsequently, in the treatment process, second precursors, which may be nitrogen-based precursors, may be introduced to react with the boron-based layer and turn the boron-based layer into the layer of first hard mask material 503.

In some embodiments, the first precursors may be, for example, diborane, borazine, or an alkyl-substituted derivative of borazine. In some embodiments, the first precursors may be introduced at a flow rate between about 5 sccm (standard cubic centimeters per minute) and about 50 slm (standard liter per minute); specifically, between about 10 sccm and about 1 slm. In some embodiments, the first precursors may be introduced by dilution gas such as nitrogen, hydrogen, argon, or a combination thereof. The dilution gas may be introduced at a flow rate between about 5 sccm and about 50 slm or between about 1 slm and about 10 slm.

In some embodiments, the film formation process may be performed without an assistant of plasma. In such situation, a substrate temperature of the film formation process may be between about 100° C. and about 1000° C. For example, the substrate temperature of the film formation process may be between about 300° C. and about 500° C. A process pressure of the film formation process may be between about 10 mTorr and about 760 Torr. For example, the process pressure of the film formation process may be between about 2 Torr and about 10 Torr.

In some embodiments, the film formation process may be performed in the presence of plasma. In such situation, a substrate temperature of the film formation process may be between about 100° C. and about 1000° C. For example, the substrate temperature of the film formation process may be between about 300° C. and about 500° C. A process pressure of the film formation process may be between about 10 mTorr and about 760 Torr. For example, the process pressure of the film formation process may be between about 2 Torr and about 10 Torr. The plasma may be provided by a RF power between 2 W and 5000 W. For example, the RF power of the plasma may be between 30 W and 1000 W.

In some embodiments, the second precursors may be, for example, ammonia or hydrazine. In some embodiments, the second precursors may be introduced at a flow rate between about 5 sccm and about 50 slm; specifically, between about 10 sccm and about 1 slm.

In some embodiments, oxygen-based precursors may be together introduced with the second precursors in the treatment process. The oxygen-based precursors may be, for example, oxygen, nitric oxide, nitrous oxide, carbon dioxide, or water.

In some embodiments, silicon-based precursors may be together introduced with the second precursors in the treatment process. The silicon-based precursors may be, for example, silane, trisilylamine, trimethylsilane, or silazanes (e.g., hexamethylcyclotrisilazane).

In some embodiments, phosphorus-based precursors may be together introduced with the second precursors in the treatment process. The phosphorus-based precursors may be, for example, phosphine.

In some embodiments, oxygen-based precursors, silicon-based precursors, or phosphorus-based precursors may be together introduced with the second precursors in the treatment process.

In some embodiments, the treatment process may be performed with an assistant of a plasma process, an ultraviolet (UV) cure process, a thermal anneal process, or a combination thereof.

When the treatment is performed with the assistant of the plasma process. Plasma of the plasma process may be provided by the RF power. In some embodiments, the RF power may be between about 2 W and about 5000 W at a single low frequency of between about 100 kHz up to about 1 MHz. In some embodiments, the RF power may be between about 30 W and about 1000 W at a single high frequency of greater than about 13.6 MHz. In such situation, a substrate temperature of the treatment process may be between about 20° C. and about 1000° C. A process pressure of the treatment process may be between about 10 mTorr and about 760 Torr.

When the treatment is performed with the assistance of UV cure process, in such situation, a substrate temperature of the treatment process may be between about 20° C. and about 1000° C. A process pressure of the treatment process may be between about 10 mTorr and about 760 Torr. The UV cure may be provided by any UV source, such as mercury microwave arc lamps, pulsed xenon flash lamps, or high-efficiency UV light emitting diode arrays. The UV source may have a wavelength of between about 170 nm and about 400 nm. The UV source may provide a photon energy between about 0.5 eV and about 10 eV or between about 1 eV and about 6 eV. The assistant of the UV cure process may remove hydrogen from the hard mask layer 105. As hydrogen may diffuse through into other areas of the semiconductor structure 1 and may degrade the reliability of the semiconductor structure 1, the removal of hydrogen by the assistant of UV cure process may improve the reliability of the semiconductor structure 1. In addition, the UV cure process may increase the density of the layer of first hard mask material 503.

When the treatment is performed with the assistant of the thermal anneal process. In such situation, a substrate temperature of the treatment process may be between about 20° C. and about 1000° C. A process pressure of the treatment process may be between about 10 mTorr and about 760 Torr.

Alternatively, in some embodiments, when the layer of first hard mask material 503 is composed of carbon, hydrogen, and oxygen, the layer of first hard mask material 503 may be formed by a high density plasma chemical vapor deposition process. The high density plasma may be generated using inductively coupled radio frequency power in a range between about 500 watts and about 4000 watts. In some embodiments, the high density plasma may be generated using a capacitively coupled RF power in a range between about 500 watts and about 4000 watts. The source of carbon may be methane, ethane, ethyne, benzene, or a combination thereof. The flow rate of the source of carbon may be between about 50 standard cubic feet per minute (sccm) and about 150 sccm. The source of carbon may provide polymerization of carbon to form carbon-carbon chains. An inert gas such as argon, neon, or helium may be used as carrier gas to carry the source of carbon. The flow rate of the carrier gas may be between about 10 sccm and about 150 sccm. The process pressure of the high density plasma chemical vapor deposition process may be about 5 millitorr and about 20 millitorr. The process temperature of the high density plasma chemical vapor deposition process may be between about 240° C. and about 340° C.

In some embodiments, the layer of first hard mask material 503 may be formed with fluorine doping by adding a source of fluorine during the high density plasma chemical vapor deposition process. The source of fluorine may be, for example, octafluorocyclobutane, tetrafluoromethane, hexafluoroethane, octafluoropropane, trifluoromethane, hexafluorobenzene, or a combination thereof. The flow rate of the source of fluorine may be between slightly greater 0 and about 150 sccm. The flow rate ratio of the source of fluorine to the source of carbon is important for the doping level and the thermal stability of the carbon hard mask layer 105. For an unbiased process situation, the flow rate ratio of the source of fluorine to the source of carbon may be between about 0.2 and about 2. For a biased process situation, the flow rate ratio of the source of fluorine to the source of carbon may be between about 0.7 and about 1.3.

In some embodiments, an annealing process may be performed after the high density plasma chemical vapor deposition process to enhance the thermal stability of the layer of first hard mask material 503. The annealing process may be carried out in vacuum, or in an inert atmosphere composed of gasses such as argon or nitrogen, at a temperature between about 300° C. and about 450° C. for approximately 30 minutes.

The thickness and uniformity of the layer of first hard mask material 503 formed by the high density plasma chemical vapor deposition process may be well controlled. For example, the standard deviation of the thickness of the layer of first hard mask material 503 may be less than 4%. In addition, the layer of first hard mask material 503 formed by the high density plasma chemical vapor deposition process may be thermally stable at elevated temperatures up to approximately 400° C. Thermal stability means that the layer of first hard mask material 503 will not suffer from weight loss, deformation or chemical reactions when exposed to etch environments at temperatures between about 200° C. and about 400° C. The thermal stability of the layer of first hard mask material 503 at elevated temperatures, will allow for its use as a mask for etch operations that are performed at temperatures higher than 200° C. Furthermore, the etch resistance property of the layer of first hard mask material 503 may be tuned by adjusting the doping level of fluorine. The etch resistive property of the layer of first hard mask material 503 may be decreased with higher doping level of fluorine.

Alternatively, in some embodiments, when the layer of first hard mask material 503 is a carbon film, the layer of first hard mask material 503 may be deposited by a process including introducing a processing gas mixture, consisting of one or more hydrocarbon compounds, into a processing chamber. The hydrocarbon compound has a formula $C_xH_y$, where x has a range of between 2 and 4 and y has a range of between 2 and 10. The hydrocarbon compounds may be, for example, propylene ($C_3H_6$), propyne ($C_3H_4$), propane ($C_3H_8$), butane ($C_4H_{10}$), butylene ($C_4H_8$), butadiene ($C_4H_6$), or acetylene ($C_2H_2$), or a combination thereof.

In some embodiments, the carbon film may be deposited from the processing gas mixture by maintaining a substrate temperature between about 100° C. and about 700° C.; specifically, between about 350° C. and about 550° C. In some embodiments, the carbon film may be deposited from the processing gas mixture by maintaining a chamber pressure between about 1 Torr and about 20 Torr. In some embodiments, the carbon film may be deposited from the processing gas mixture by introducing the hydrocarbon gas, and any inert, or reactive gases respectively, at a flow rate between about 50 sccm and about 2000 sccm.

In some embodiments, the processing gas mixture may further include an inert gas, such as argon. However, other inert gases, such as nitrogen or other noble gases, such as helium may also be used. Inert gases may be used to control the density and deposition rate of the carbon film. Additionally, a variety of gases may be added to the processing gas mixture to modify properties of the carbon film. The gases may be reactive gases, such as hydrogen, ammonia, a mixture of hydrogen and nitrogen, or a combination thereof. The addition of hydrogen or ammonia may be used to control the hydrogen ratio of the carbon film to control layer properties, such as etch selectivity, chemical mechanical polishing resistance property, and reflectivity. In some embodiments, a mixture of reactive gases and inert gases may be added to the processing gas mixture to deposit the carbon film.

The carbon film may include carbon and hydrogen atoms, which may be an adjustable carbon:hydrogen ratio that ranges from about 10% hydrogen to about 60% hydrogen. Controlling the hydrogen ratio of the carbon film may tune the respective etch resistance property and chemical mechanical polishing resistance property. As the hydrogen content decreases, the etch resistance property, and thus the etch selectivity, of the carbon film increases. The reduced rate of removal of the carbon film may make the carbon film suitable for being a mask layer when performing an etch process to transfer the desire pattern onto the underlying layers.

With reference to FIG. 6, the layer of second hard mask material 507 may be formed on the layer of first hard mask material 503 and above the dense area DA and the loose area LA of the substrate 101. In some embodiments, the second hard mask material 507 may be a material having etching selectivity to the first hard mask material 503. In some embodiments, the second hard mask material 507 may be a material having etching selectivity to the anti-back sputtering layer 201 and/or the first conductive material 501.

In some embodiments, the second hard mask material 507 may be, for example, silicon nitride, silicon nitride oxide, silicon oxy nitride, silicon oxide, boron nitride, silicon boron nitride, phosphorus boron nitride, or boron carbon silicon nitride.

In some embodiments, the second hard mask material 507 may be composed of carbon, hydrogen, and oxygen. In some embodiments, the second hard mask material 507 may be composed of carbon, hydrogen, and fluorine. In some embodiments, the layer of second hard mask material 507 may be a carbon film. The layer of second hard mask material 507 may be formed with a procedure similar to the layer of first hard mask material 503, and descriptions thereof are not repeated herein.

With reference to FIG. 6, a first mask layer 601 may be formed on the first hard mask material 503. The first mask layer 601 may be formed above the dense area DA and the loose area LA. The first mask layer 601 may include the pattern of the plurality of first hard mask structures 310 and the plurality of second hard mask structures 320 which will be illustrated later. In some embodiments, the first mask layer 601 may be a photoresist layer.

Figure 7:
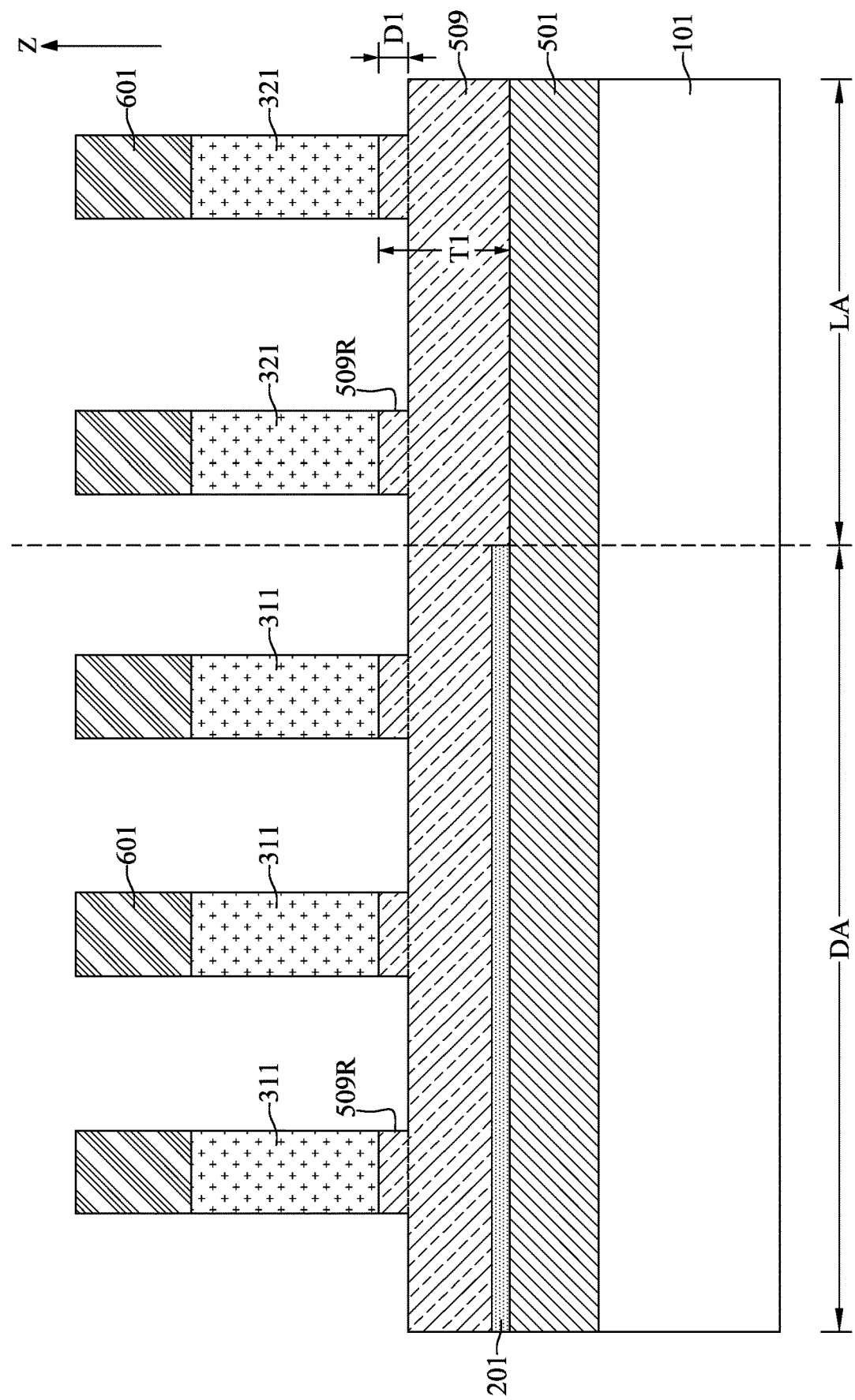
Figure 8:
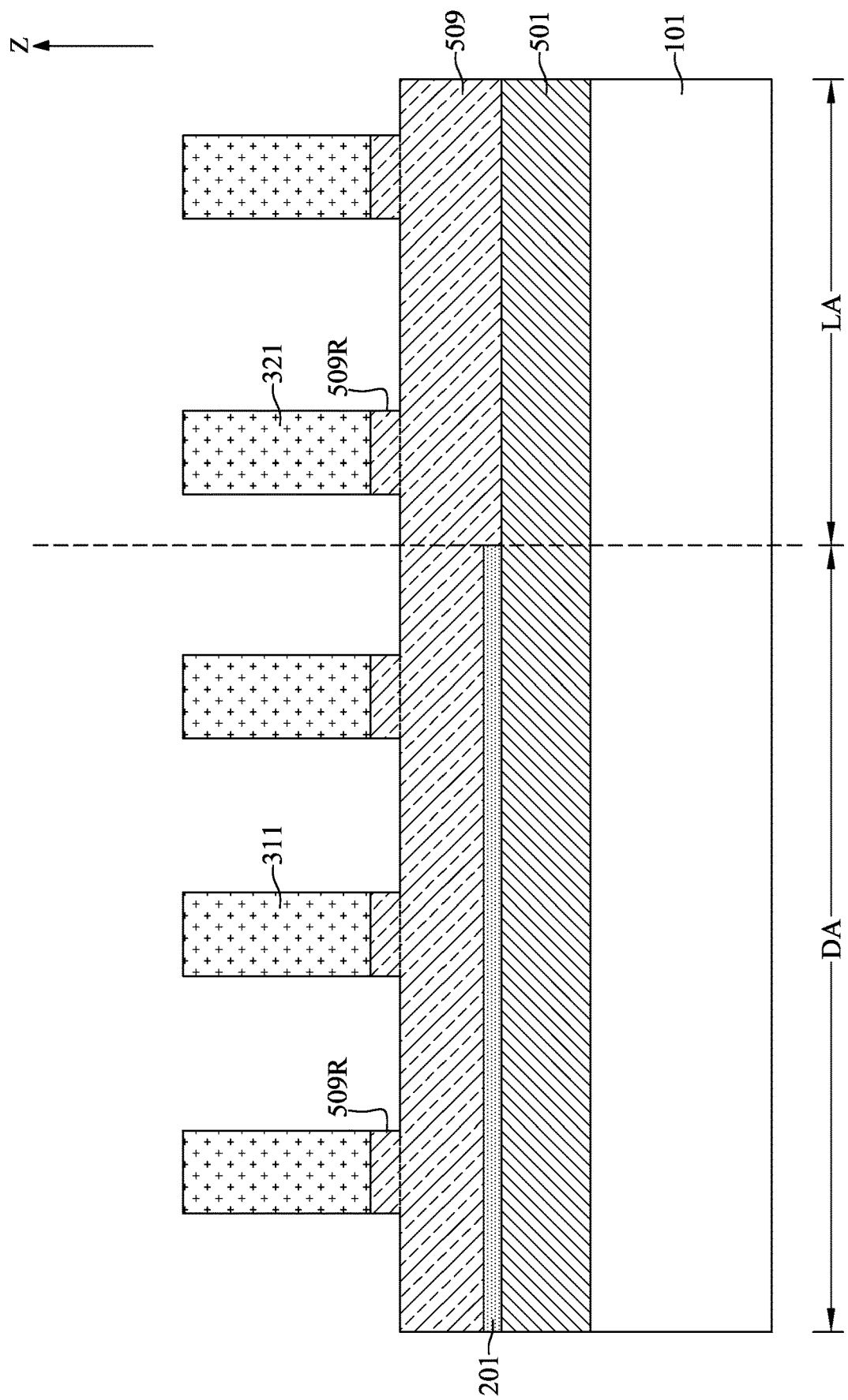

With reference to FIGS. 1, 7, and 8, at step S15, a first hard mask removal process may be performed to turn the layer of second hard mask material 507 into a plurality of first top hard mask layers 311 and a plurality of second top hard mask layers 321, and turn the layer of first hard mask material 503 into an intermediate hard mask layer 509.

With reference to FIG. 7, the first hard mask removal process may be performed using the first mask layer 601 as the mask to transfer the pattern of the first mask layer 601 to the layer of second hard mask material 507. After the first removal process, the layer of second hard mask material 507 may be turned into the plurality of first top hard mask layers 311 and the plurality of second top hard mask layers 321. The plurality of first top hard mask layers 311 may be formed above the dense area DA of the substrate 101 and the plurality of second top hard mask layers 321 may be formed above the loose area LA of the substrate 101.

In some embodiments, the removal rate ratio of the second hard mask material 507 to the first mask layer 601 may be between about 100:1 and about 1.05:1, between about 15:1 and about 2:1, or between about 10:1 and about 2:1 during the first hard mask removal process. In some embodiments, the removal rate ratio of the second hard mask material 507 to the first hard mask material 503 may be between about 100:1 and about 1.05:1, between about 15:1 and about 2:1, or between about 10:1 and about 2:1 during the first hard mask removal process.

With reference to FIG. 7, in some embodiments, a portion of the first hard mask material 503 may be also removed during the first hard mask removal process. Hence, the layer of first hard mask material 503 may be turned into the intermediate hard mask layer 509. A plurality of recesses 509R may be formed between the plurality of first top hard mask layers 311 and between the plurality of second top hard mask layers 321. The ratio of the thickness T1 of the intermediate hard mask layer 509 to the depth D1 of the plurality of the recesses 509R may be between about 100:1 and about 15:1, between about 80:1 and about 20:1, or between about 70:1 and about 25:1.

In some embodiments, the first hard mask material 503 may not be removed during the first hard mask removal process. In other words, the layer of first hard mask material 503 may be intact and no recess is formed.

With reference to FIG. 8, after the first hard mask removal process, the first mask layer 601 may be removed by any applicable process. For example, the first mask layer 601 may be removed by an ashing process.

Figure 9:
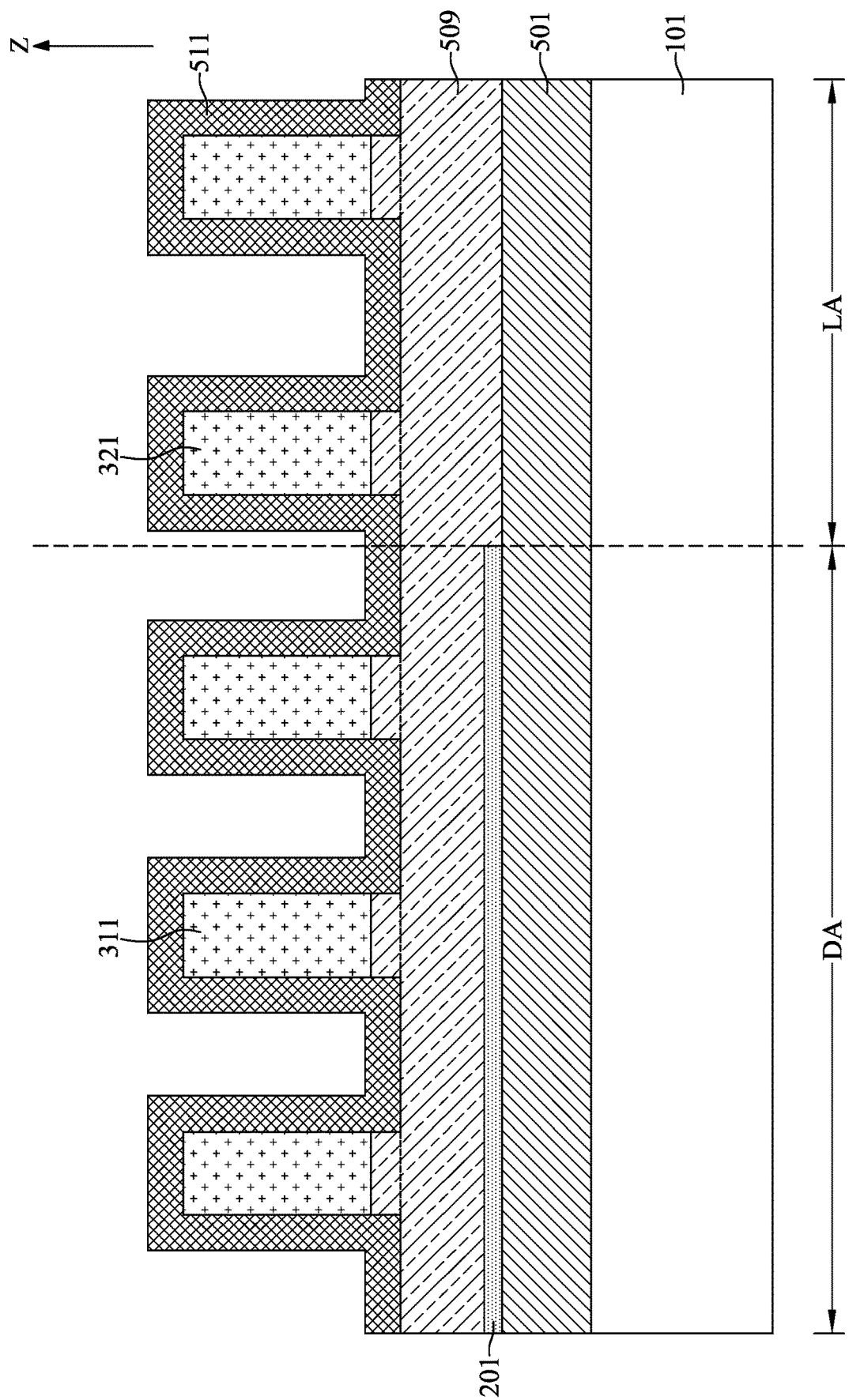
Figure 10:
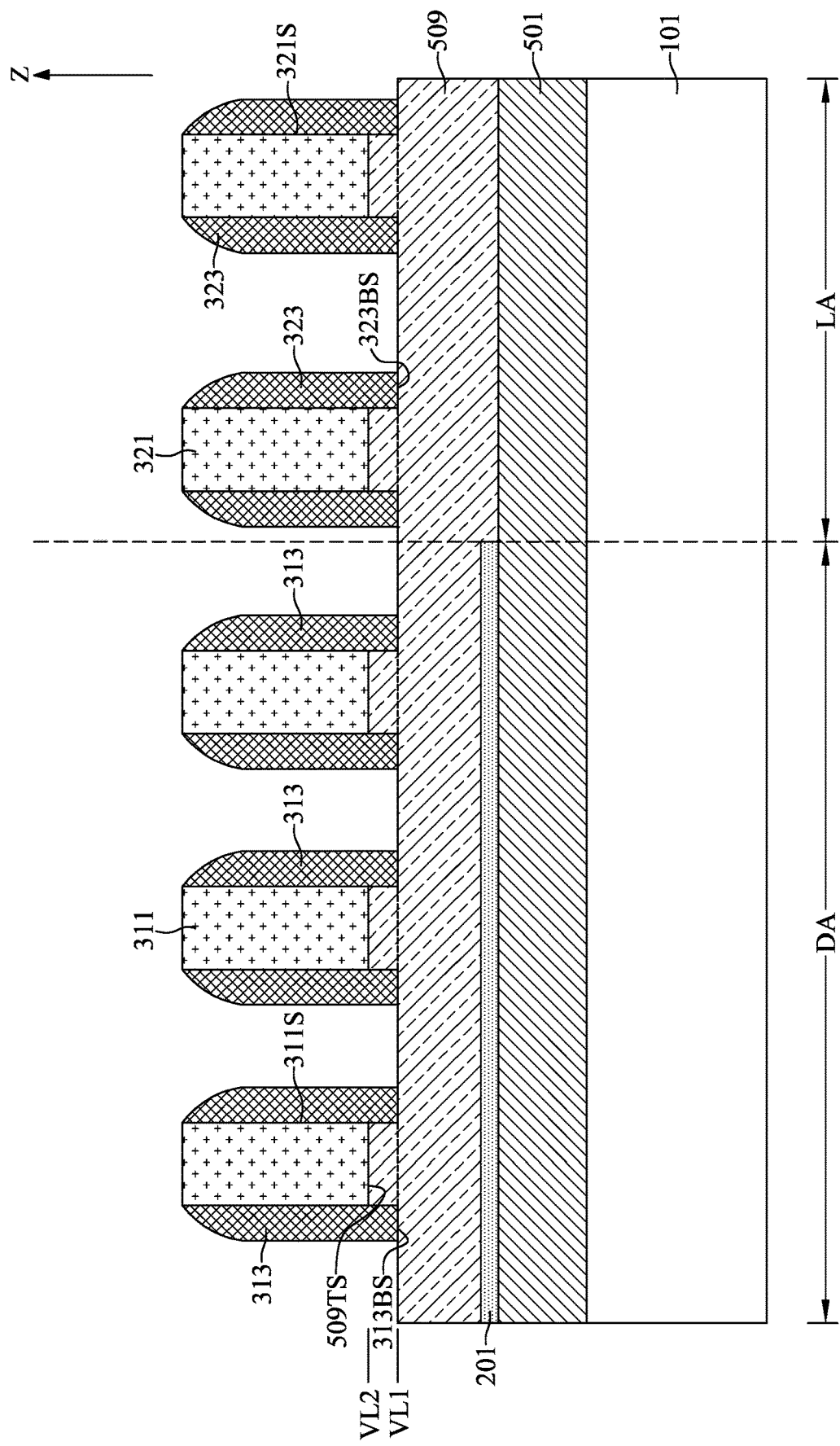

With reference to FIGS. 1, 9, and 10, at step S17, a plurality of first sidewall hard mask layers 313 may be formed on the plurality of first top hard mask layers 311 and a plurality of second sidewall hard mask layers 323 may be formed on the plurality of second top hard mask layers 321.

With reference to FIG. 9, a layer of sidewall hard mask material 511 may be conformally formed to cover the plurality of first top hard mask layers 311, the plurality of second top hard mask layers 321, and the intermediate hard mask layer 509. In some embodiments, the sidewall hard mask material 511 may be the same material as the first hard mask material 503. In some embodiments, the sidewall hard mask material 511 may be a material having etching selectivity to the anti-back sputtering layer 201 and/or the first conductive material 501. In some embodiments, the sidewall hard mask material 511 may be a material having etching selectivity to the plurality of first top hard mask layers 311 and the plurality of second top hard mask layers 321.

In some embodiments, the sidewall hard mask material 511 may be, for example, silicon nitride, silicon nitride oxide, silicon oxy nitride, silicon oxide, boron nitride, silicon boron nitride, phosphorus boron nitride, or boron carbon silicon nitride.

In some embodiments, the sidewall hard mask material 511 may be composed of carbon, hydrogen, and oxygen. In some embodiments, the sidewall hard mask material 511 may be composed of carbon, hydrogen, and fluorine. In some embodiments, the layer of sidewall hard mask material 511 may be a carbon film. The sidewall hard mask material 511 may be formed with a procedure similar to the layer of first hard mask material 503, and descriptions thereof are not repeated herein.

With reference to FIG. 10, spacer etching process may be performed to remove a portion of the sidewall hard mask material 511. After the spacer etching process, the remaining sidewall hard mask material 511 may be referred to as the plurality of first sidewall hard mask layers 313 and the plurality of second sidewall hard mask layers 323. In some embodiments, the etch rate ratio of the sidewall hard mask material 511 to the plurality of first top hard mask layers 311 (or the plurality of second top hard mask layers 321) may be between about 100:1 and about 2:1, between about 15:1 and about 2:1, or between about 10:1 and about 2:1 during the spacer etching process.

With reference to FIG. 10, the plurality of first sidewall hard mask layers 313 may be formed above the dense area DA of the substrate 101, on the intermediate hard mask layer 509, and attached to the sidewalls 311S of the plurality of first top hard mask layers 311. The plurality of second sidewall hard mask layers 323 may be formed above the loose area LA of the substrate 101, on the intermediate hard mask layer 509, and attached to the sidewalls 321S of the plurality of second top hard mask layers 321. The vertical level VL1 of the bottom surfaces 313BS of the plurality of first sidewall hard mask layers 313 and the bottom surfaces 323BS of the plurality of second sidewall hard mask layers 323 may be lower than the vertical level VL2 of the top surface 509TS of the intermediate hard mask layer 509.

Figure 11:
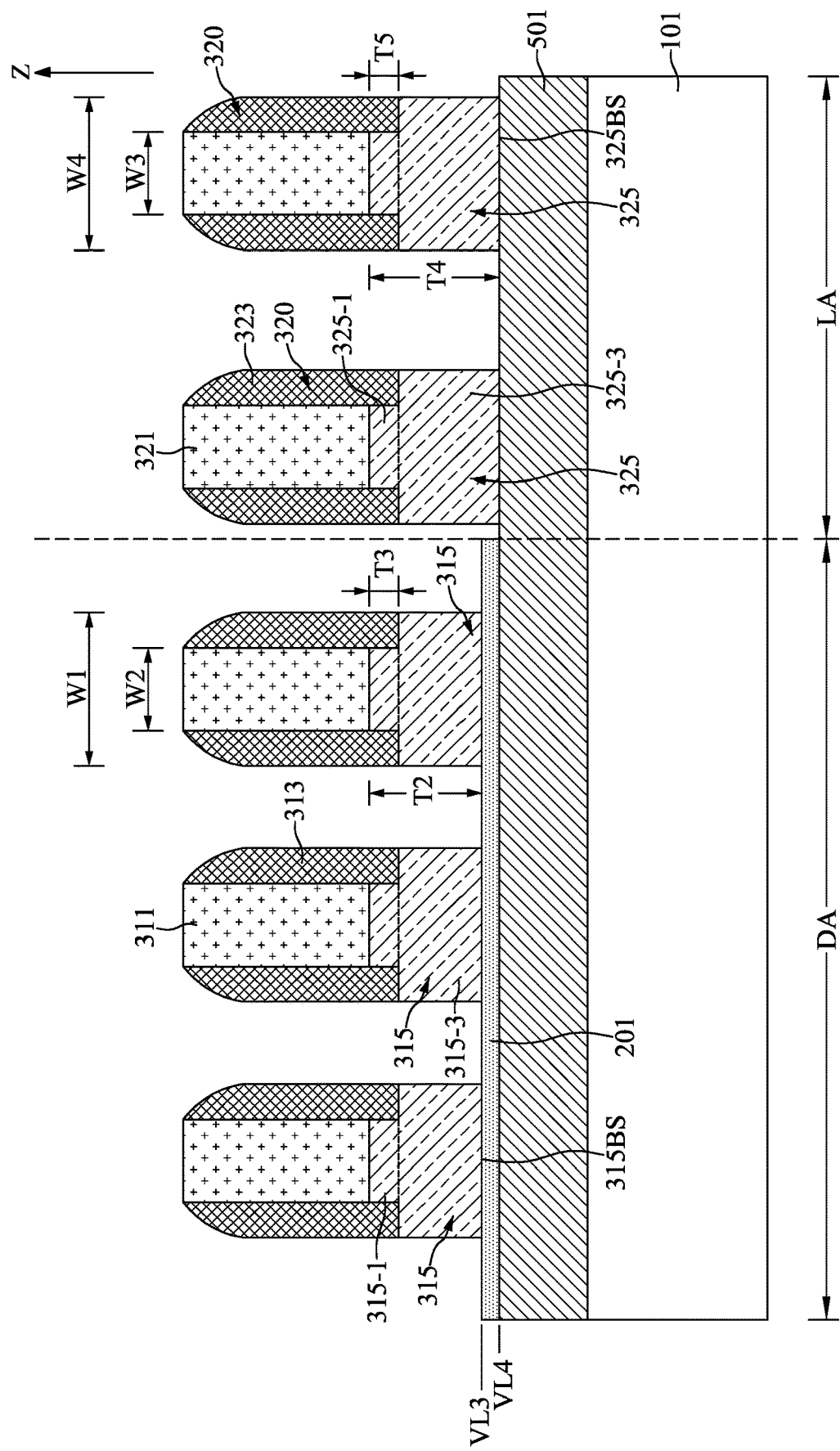

With reference to FIGS. 1 and 11, at step S19, a second hard mask removal process may be performed to turn the intermediate hard mask layer 509 into a plurality of first bottom hard mask layers 315 and a plurality of second bottom hard mask layers 325 and configure a plurality of second hard mask structures 320.

With reference to FIG. 11, the second hard mask removal process may be performed to remove a portion of the intermediate hard mask layer 509 (i.e., the first hard mask material 503). After the second hard mask removal process, the intermediate hard mask layer 509 (or the remaining first hard mask material 503) may be turned into the plurality of first bottom hard mask layers 315 and the plurality of second bottom hard mask layers 325. In some embodiments, the removal rate ratio of the intermediate hard mask layer 509 to the anti-back sputtering layer 201 may be between about 100:1 and about 1.05:1, between about 15:1 and about 2:1, or between about 10:1 and about 2:1 during the second hard mask removal process. In some embodiments, the removal rate ratio of the intermediate hard mask layer 509 to the plurality of first top hard mask layers 311 (or the plurality of second top hard mask layers 321) may be between about 100:1 and about 1.05:1, between about 15:1 and about 2:1, or between about 10:1 and about 2:1 during the second hard mask removal process. In some embodiments, the removal rate ratio of the intermediate hard mask layer 509 to the first conductive material 501 may be between about 100:1 and about 1.05:1, between about 15:1 and about 2:1, or between about 10:1 and about 2:1 during the second hard mask removal process.

With reference to FIG. 11, the plurality of first bottom hard mask layers 315 may be formed on the anti-back sputtering layer 201 and above the dense area DA of the substrate 101. In some embodiments, each of the first bottom hard mask layer 315 may include a first protruding portion 315-1 and a first bottom portion 315-3. The first bottom portion 315-3 may be formed on the anti-back sputtering layer 201 and the first protruding portion 315-1 may be formed between the first bottom portion 315-3 and the first top hard mask layer 311. The width W1 of the first bottom portion 315-3 may be greater than the width W2 of the first protruding portion 315-1. The thickness ratio of the thickness T2 of the first bottom hard mask layer 315 to the thickness of the first protruding portion 315-1 may be between about 95:1 and about 15:1, between about 75:1 and about 20:1, or between about 65:1 and about 25:1.

With reference to FIG. 11, the plurality of second bottom hard mask layers 325 may be formed on the layer of first conductive material 501 and above the loose area LA of the substrate 101. The plurality of second top hard mask layer 321, the plurality of second sidewall hard mask layers 323, and the plurality of second bottom hard mask layers 325 together configure a plurality of second hard mask structures 320. In some embodiments, each of the plurality of second bottom hard mask layers 325 may include a second protruding portion 325-1 and a second bottom portion 325-3. The second bottom portion 325-3 may be formed on the layer of first conductive material 501 and the second protruding portion 325-1 may be formed between the second bottom portion 325-3 and the second top hard mask layer 321. The width W4 of the second bottom portion 325-3 may be greater than the width W3 of the second protruding portion 325-1. The thickness ratio of the thickness T4 of the second bottom hard mask layer 325 to the thickness of the second protruding portion 325-1 may be between about 100:1 and about 15:1, between about 80:1 and about 20:1, or between about 70:1 and about 25:1.

With reference to FIG. 11, the vertical level VL3 of the bottom surfaces 315BS of the plurality of first bottom hard mask layers 315 may be higher than the vertical level VL4 of the bottom surfaces 325BS of the plurality of second bottom hard mask layers 325.

Figure 12:
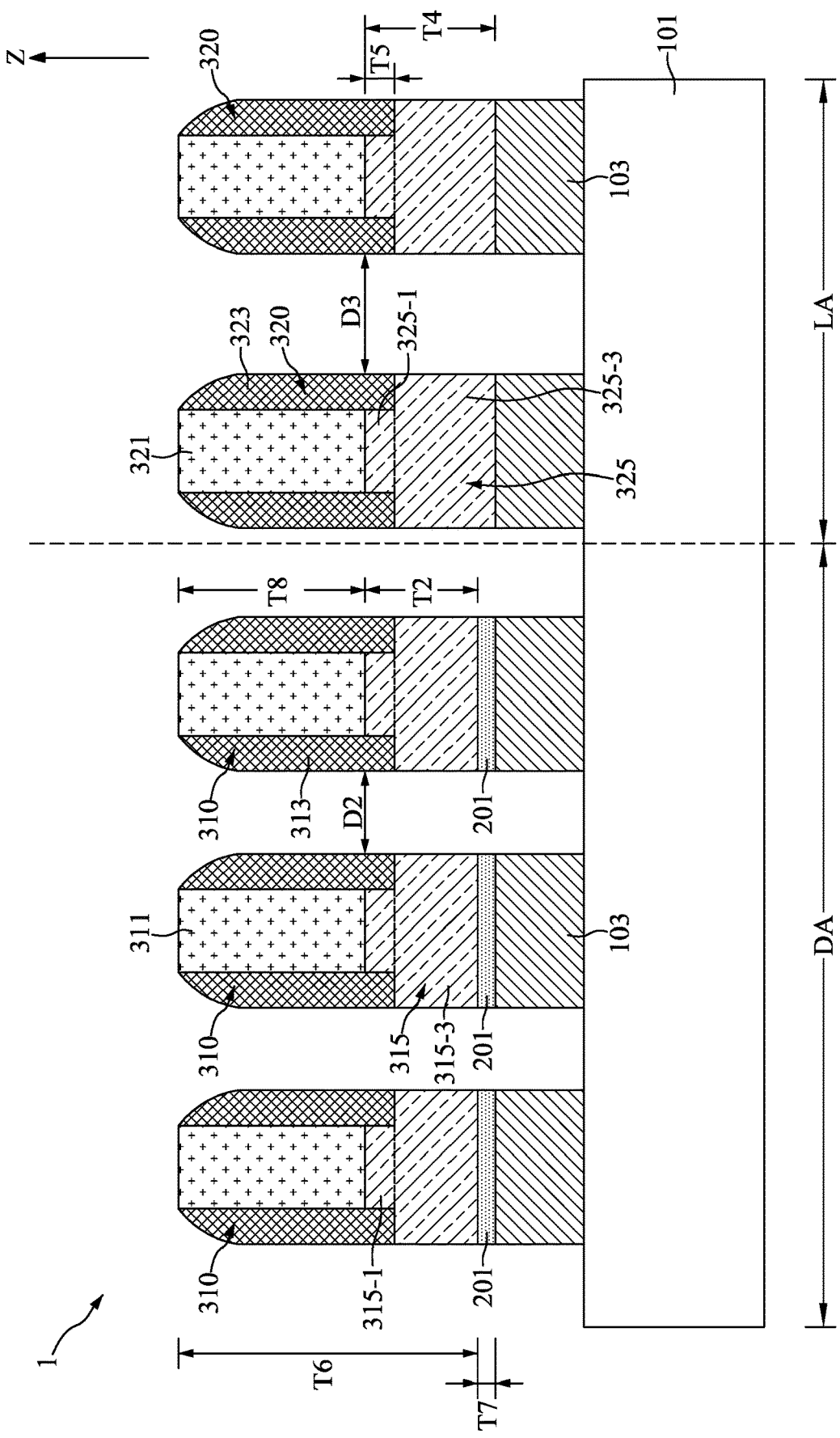

With reference to FIGS. 1 and 12, at step S21, a breakthrough process may be performed to turn the layer of first conductive material 501 into a plurality of conductive features 103 and configure a plurality of first hard mask structures 310.

With reference to FIG. 12, the breakthrough process may be performed using the plurality of first top hard mask layers 311, the plurality of second top hard mask layers 321, the plurality of first sidewall hard mask layers 313, and the plurality of second sidewall hard mask layers 323 as masks to remove a portion of the anti-back sputtering layer 201 and a portion of the layer of first conductive material 501. After the breakthrough process, the anti-back sputtering layer 201 may be divided into multiple segments. The plurality of anti-back sputtering layers 201 may be formed below the plurality of first bottom hard mask layers 315, respectively and correspondingly. The remaining first conductive material 501 may be referred to as the plurality of conductive features 103. The plurality of conductive features 103 may be formed between the plurality of anti-back sputtering layers 201 and the substrate 101 and between the plurality of second bottom hard mask layers 325 and the substrate 101, respectively and correspondingly.

With reference to FIG. 12, the plurality of first top hard mask layers 311, the plurality of first sidewall hard mask layers 313, the plurality of first bottom hard mask layers 315, and the plurality of anti-back sputtering layers 201 together configure a plurality of first hard mask structures 310. In some embodiments, the thickness ratio of the thickness T6 of the plurality of first hard mask structures 310 to the thickness T7 of the plurality of anti-back sputtering layers 201 may be between about 10:1 and about 20:1.

In some embodiments, the breakthrough process may be a single stage etching process such as an anisotropic etching process. The etch rate ratio of the anti-back sputtering layer 201 to the plurality of first top hard mask layers 311 (or the plurality of second top hard mask layers 321) may be between about 100:1 and about 1.05:1, between about 15:1 and about 2:1, or between about 10:1 and about 2:1 during the breakthrough process. The etch rate ratio of the anti-back sputtering layer 201 to the plurality of first sidewall hard mask layers 313 (or the plurality of second sidewall hard mask layers 323) may be between about 100:1 and about 1.05:1, between about 15:1 and about 2:1, or between about 10:1 and about 2:1 during the breakthrough process. The etch rate ratio of the first conductive material 501 to the plurality of first top hard mask layers 311 (or the plurality of second top hard mask layers 321) may be between about 100:1 and about 1.05:1, between about 15:1 and about 2:1, or between about 10:1 and about 2:1 during the breakthrough process. The etch rate ratio of the first conductive material 501 to the plurality of first sidewall hard mask layers 313 (or the plurality of second sidewall hard mask layers 323) may be between about 100:1 and about 1.05:1, between about 15:1 and about 2:1, or between about 10:1 and about 2:1 during the breakthrough process.

In some embodiments, the breakthrough process may be a multi-stage etching process such as a two-stage etching process. The first stage is performed to remove the exposed anti-back sputtering layer 201 and the second stage is performed to remove the exposed first conductive material 501.

The etch rate ratio of the anti-back sputtering layer 201 to the plurality of first top hard mask layers 311 (or the plurality of second top hard mask layers 321) may be between about 100:1 and about 1.05:1, between about 15:1 and about 2:1, or between about 10:1 and about 2:1 during the first stage of the breakthrough process. The etch rate ratio of the anti-back sputtering layer 201 to the plurality of first sidewall hard mask layers 313 (or the plurality of second sidewall hard mask layers 323) may be between about 100:1 and about 1.05:1, between about 15:1 and about 2:1, or between about 10:1 and about 2:1 during the first stage of the breakthrough process. The etch rate ratio of the anti-back sputtering layer 201 to the first conductive material 501 may be between about 100:1 and about 1.05:1, between about 15:1 and about 2:1, or between about 10:1 and about 2:1 during the first stage of the breakthrough process.

The etch rate ratio of the first conductive material 501 to the plurality of first top hard mask layers 311 (or the plurality of second top hard mask layers 321) may be between about 100:1 and about 1.05:1, between about 15:1 and about 2:1, or between about 10:1 and about 2:1 during the second stage of the breakthrough process. The etch rate ratio of the first conductive material 501 to the plurality of first sidewall hard mask layers 313 (or the plurality of second sidewall hard mask layers 323) may be between about 100:1 and about 1.05:1, between about 15:1 and about 2:1, or between about 10:1 and about 2:1 during the second stage of the breakthrough process.

With reference to FIG. 12, the dense area DA may have an element density greater than that of the loose area LA. The element density may be a value defined by the elements (e.g., plurality of first hard mask structures 310 and the plurality of second hard mask structures 320) disposed above the dense area DA or the loose area LA divided by surface areas of the dense area DA or loose area LA from a top-view perspective. From a cross-sectional perspective, a greater density may mean a smaller horizontal distance between adjacent elements. For example, the distance D2 between an adjacent pair of the plurality of first hard mask structures 310 may be less than the distance D3 between an adjacent pair of the plurality of second hard mask structures 320.

In some embodiments, the thickness T8 of the first top hard mask layer 311 may be greater than the thickness T2 of the first bottom hard mask layer 315. In some embodiments, the thickness T8 of the plurality of second top hard mask layers 321 may be greater than the thickness T4 of the second bottom hard mask layer 325.

In some embodiments, the plurality of first top hard mask layers 311 and the plurality of second top hard mask layers 321 may serve as dielectric anti-reflective coating layers to improve the performance of the photolithography process.

Conventionally, the anti-back sputtering layer 201 is absent during the patterning of the hard mask layers. Therefore, the underlying conductive layer may be back sputtered during the patterning of the hard mask layers to cause polymers (side products originated from the back sputtering of the underlying conductive layer) to attach on the patterned hard mask layers. As a result, the profile of the patterned hard mask layers may be affected so as to the patterning of the underlying conductive layer will also be affected. For example, the resulting conductive features may be short due to incomplete removal of the underlying conductive layer.

In contrast, with the presence of the anti-back sputtering layer 201, the back sputtering of the underlying conductive layer (e.g., the layer of first conductive material 501) during patterning of the hard mask layer may be avoided. As a result, the yield of fabrication of the semiconductor structure 1 may be improved.

One aspect of the present disclosure provides a semiconductor structure including a substrate; a conductive feature positioned on the substrate; an anti-back sputtering layer positioned on the conductive feature; and a first hard mask structure positioned on the anti-back sputtering layer. The anti-back sputtering layer has etching selectivity to the first hard mask structure.

Another aspect of the present disclosure provides a semiconductor structure including a substrate including a dense area and a loose area; a plurality of first conductive features positioned on the dense area and a plurality of second conductive features positioned on the loose area; a plurality of anti-back sputtering layers positioned on the plurality of first conductive features; a plurality of first hard mask structures positioned on the plurality of anti-back sputtering layers; and a plurality of second hard mask structures positioned on the plurality of second conductive features. The plurality of anti-back sputtering layers have etching selectivity to the plurality of first hard mask structures.

Another aspect of the present disclosure provides a method for fabricating a semiconductor structure including providing a substrate; forming a layer of first conductive material on the substrate; forming an anti-back sputtering layer on the layer of first conductive material; forming a layer of first hard mask material on the anti-back sputtering layer; forming a layer of second hard mask material on the layer of first hard mask material; performing a first hard mask removal process to turn the layer of second hard mask material into a first top hard mask layer; forming a plurality of first sidewall hard mask layers on sidewalls of the first top hard mask layer; performing a second hard mask removal process to turn the layer of first hard mask material into a first bottom hard mask layer; and performing a breakthrough process to remove the anti-back sputtering layer not covered by the first top hard mask layer, the plurality of first sidewall hard mask layers, and the first bottom hard mask layer and turn the layer of first conductive material into a conductive feature. The first top hard mask layer, the plurality of first sidewall hard mask layers, and the first bottom hard mask layer together configure a first hard mask structure. The anti-back sputtering layer has etching selectivity to the first hard mask structure.

Due to the design of the semiconductor structure of the present disclosure, the defects (such as short of conductive features) originated from the back sputtering of underlying conductive layer during the patterning of the hard mask layers (e.g., the plurality of first bottom hard mask layers 315) may be avoided by the anti-back sputtering layer 201. As a result, the yield of fabrication of the semiconductor structure 1 may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor structure, comprising:
a substrate;
a conductive feature positioned on the substrate;
an anti-back sputtering layer positioned on the conductive feature; and
a first hard mask structure positioned on the anti-back sputtering layer;
wherein the anti-back sputtering layer has etching selectivity to the first hard mask structure;
wherein a ratio of a thickness of the first hard mask structure to a thickness of the anti-back sputtering layer is between about 10:1 and about 20:1;
wherein the first hard mask structure comprises:
a first bottom hard mask layer positioned on the anti-back sputtering layer; and
a first top hard mask layer positioned on the first bottom hard mask layer and comprising a stack of two layers;
wherein an upper layer of the stack has etching selectivity to the first bottom hard mask layer;
wherein the first bottom hard mask layer comprises:
a first bottom portion positioned on the anti-back sputtering layer; and
a first protruding portion positioned between the first top hard mask layer and the first bottom portion;
wherein the first bottom hard mask layer and a lower layer of the stack are made from a same material.

2. The semiconductor structure of claim 1, wherein a thickness of the first top hard mask layer is greater than a thickness of the first bottom hard mask layer.

3. The semiconductor structure of claim 1, wherein a thickness of the first top hard mask layer is greater than the thickness of the anti-back sputtering layer.

4. The semiconductor structure of claim 1, wherein the first hard mask structure comprises a first sidewall hard mask layer positioned on the first bottom hard mask layer and adjacent to the first top hard mask layer.

5. The semiconductor structure of claim 4, wherein a portion of the stack and the first sidewall hard mask layer comprise the same material.

6. The semiconductor structure of claim 1, wherein a width of the lower layer of the stack is less than a width of the first bottom portion.

7. The semiconductor structure of claim 1, wherein the anti-back sputtering layer has etching selectivity to the upper layer of the stack.

8. The semiconductor structure of claim 4, wherein the anti-back sputtering layer has etching selectivity to the first sidewall hard mask layer.

9. The semiconductor structure of claim 1, wherein the conductive feature has etching selectivity to the upper layer of the stack.

10. The semiconductor structure of claim 4, wherein the conductive feature has etching selectivity to the first sidewall hard mask layer.

* * * * *